(12) United States Patent
Jongbloed et al.

(10) Patent No.: US 9,837,281 B2
(45) Date of Patent: Dec. 5, 2017

(54) CYCLIC DOPED ALUMINUM NITRIDE DEPOSITION

(71) Applicant: ASM IP Holding B.V., Almere (NL)

(72) Inventors: Bert Jongbloed, Oud-Heverlee (BE); Dieter Pierreux, Dilbeek (BE); Werner Knaepen, Leuven (BE)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 15/164,575

(22) Filed: May 25, 2016

(65) Prior Publication Data

US 2016/0307766 A1 Oct. 20, 2016

Related U.S. Application Data

(63) Continuation-in-part of application No. 14/555,429, filed on Nov. 26, 2014.

(51) Int. Cl.
*H01L 21/308* (2006.01)
*H01L 21/02* (2006.01)
(Continued)

(52) U.S. Cl.
CPC .... *H01L 21/3081* (2013.01); *C23C 16/45561* (2013.01); *H01L 21/0228* (2013.01);
(Continued)

(58) Field of Classification Search
CPC .................. H01L 21/02178; C23C 16/45561
(Continued)

(56) References Cited

U.S. PATENT DOCUMENTS 6,506,676 B2 1/2003 Park et al.
6,759,081 B2 7/2004 Huganen et al.
(Continued)

FOREIGN PATENT DOCUMENTS

KR 14-141521 12/2014

OTHER PUBLICATIONS

Huang et al., "ALD-grown Ultrathin AlN Film for Passivation of AlGaN/GaN HEMTs", CS MANTECH Conference, Apr. 23-26, 2012, Boston, Massachusetts USA, 4 pages.
(Continued)

*Primary Examiner* — Moazzam Hossain
(74) *Attorney, Agent, or Firm* — Knobbe, Martens, Olson & Bear LLP

(57) ABSTRACT

A process for depositing doped aluminum nitride (doped AlN) is disclosed. The process comprises subjecting a substrate to temporally separated exposures to an aluminum precursor and a nitrogen precursor to form an aluminum and nitrogen-containing compound on the substrate. The aluminum and nitrogen-containing compound is subsequently exposed to a dopant precursor to form doped AlN. The temporally separated exposures to an aluminum precursor and a nitrogen precursor, and the subsequent exposure to a dopant precursor together constitute a doped AlN deposition cycle. A plurality of doped AlN deposition cycles may be performed to deposit a doped AlN film of a desired thickness. The dopant content of the doped AlN can be tuned by performing a particular ratio of 1) separated exposures to an aluminum precursor and a nitrogen precursor, to 2) subsequent exposures to the dopant. The deposition may be performed in a batch process chamber, which may accommodate batches of 25 or more substrates. The deposition may be performed without exposure to plasma.

12 Claims, 12 Drawing Sheets

(51) Int. Cl.
*H01L 21/027* (2006.01)
*H01L 21/306* (2006.01)
*H01L 21/3115* (2006.01)
*C23C 16/455* (2006.01)

(52) U.S. Cl.
CPC .... *H01L 21/0273* (2013.01); *H01L 21/02178* (2013.01); *H01L 21/02205* (2013.01); *H01L 21/3086* (2013.01); *H01L 21/30604* (2013.01); *H01L 21/3115* (2013.01)

(58) Field of Classification Search
USPC ........................................................ 438/591
See application file for complete search history.

(56) References Cited

U.S. PATENT DOCUMENTS

| | | | |
|---|---|---|---|
| 6,900,455 B2 | 5/2005 | Drewes | |
| 7,595,010 B2 | 9/2009 | Chakravarti et al. | |
| 7,776,763 B2 | 8/2010 | Reid et al. | |
| 8,097,300 B2 | 1/2012 | Clark | |
| 8,110,491 B2 | 2/2012 | Harada | |
| 8,114,763 B2 | 2/2012 | Forbes et al. | |
| 2004/0129969 A1 | 7/2004 | Colombo et al. | |
| 2005/0070126 A1 | 3/2005 | Senzaki | |
| 2007/0237698 A1* | 10/2007 | Clark | C23C 16/34 423/263 |
| 2007/0259534 A1 | 11/2007 | Reid et al. | |
| 2008/0032465 A1* | 2/2008 | Ahn | C23C 16/308 438/142 |
| 2008/0057659 A1 | 3/2008 | Forbes et al. | |
| 2008/0081113 A1* | 4/2008 | Clark | C23C 16/308 427/255.394 |
| 2008/0121962 A1 | 5/2008 | Forbes et al. | |
| 2008/0176108 A1 | 7/2008 | Cheng et al. | |
| 2011/0012109 A1* | 1/2011 | Krylouk | H01L 21/0237 257/49 |
| 2011/0083735 A1 | 4/2011 | Park et al. | |
| 2012/0181659 A1* | 7/2012 | Wang | H01L 28/56 257/532 |
| 2012/0207948 A1 | 8/2012 | Lee | |
| 2013/0140605 A1* | 6/2013 | Ramdani | H01L 21/28264 257/192 |
| 2013/0337660 A1* | 12/2013 | Ota | C23C 16/308 438/786 |
| 2014/0125203 A1* | 5/2014 | Choy | H03H 9/02118 310/365 |
| 2014/0357090 A1 | 12/2014 | Knaepen et al. | |
| 2015/0179582 A1* | 6/2015 | Baek | H01L 23/53238 257/751 |

OTHER PUBLICATIONS

Mayer et al. "Mechanism of Nucleation and Atomic Layer Growth of AlN on Si", American Chemical Society, vol. 3, pp. 641-646• 1991.

* cited by examiner

CYCLIC DOPED ALUMINUM NITRIDE DEPOSITION

CROSS REFERENCE TO RELATED APPLICATIONS

This application is a continuation-in-part of U.S. patent application Ser. No. 14/555,429, filed Nov. 26, 2014, which is hereby incorporated by reference in its entirety.

FIELD

The invention relates to the manufacture of semiconductor devices and, more particularly, the deposition of doped aluminum nitrides, for example aluminum oxynitride.

BACKGROUND

Aluminum nitride (AlN) films have a variety of uses in the manufacture of semiconductor devices. For example, AlN films may be used as hard masks for patterning underlying materials and may also be used as a constituent part in final integrated circuit structures. Various physical and electrical properties of AlN films, however, can limit their usefulness in some applications. For example, AlN films can have a high level of film stress, which can limit their compatibility with "soft" underlying materials. In addition, AlN films can have high leakage current, which can limit their use as a dielectric material in some electronic structures. Consequently, there is a continuing need for processes to deposit AlN-based films with improved physical and electrical properties.

SUMMARY

In accordance with one aspect, a method for integrated circuit fabrication is provided. The method comprises forming an amorphous doped AlN film on a substrate. The doped AlN film is formed by performing a plurality of aluminum and nitrogen deposition cycles to form an AlN film and decreasing a crystallinity of the AlN film by doping the AlN film. Each aluminum and nitrogen deposition cycle comprises exposing the substrate to an aluminum precursor, and subsequently exposing the substrate to a nitrogen precursor.

In accordance with another aspect, a method for integrated circuit fabrication comprises subjecting a substrate to temporally separated exposures of an aluminum precursor and a nitrogen precursor to form an aluminum and nitrogen-containing film on the substrate. The aluminum and nitrogen-containing film is subsequently doped. Subjecting the substrate and subsequently doping are repeated to form a doped AlN film. Optionally, the doped aluminum and nitrogen-containing film can be patterned, thus producing a patterned AlN-containing hardmask. An underlying portion of the substrate may subsequently be etched through the patterned AlN-containing hardmask.

In some embodiments, the doped AlN is formed in a batch process chamber, preferably a hot wall batch process chamber. The doped AlN formation may be accomplished without exposing the substrate to plasma. In some embodiments, a ratio of exposures of the substrate to the dopant precursor and the nitrogen precursor is about 1:6 or less, including about 1:10 or less. In some embodiments, the ratio of exposures of the substrate to the dopant precursor and the nitrogen precursor is selected to achieve a dopant content or range of dopant contents in a doped AlN hardmask so that the hardmask has a desired etchant selectivity. In some embodiments, the exposure to the dopant precursor may comprise subjecting the substrate to temporally separated exposures to an aluminum precursor and the dopant precursor.

The doped AlN film may be deposited on a "soft material", including spin-coated materials such as photoresist. In some embodiments, the doped AlN film may be used as a hard mask for patterning processes. Advantageously, the doped AlN may have a low leakage current density and may also be used as part of a final integrated circuit structure.

In some embodiments, a semiconductor processing reactor is configured to deposit the doped AlN film. The reactor may comprise a reaction chamber; a source of aluminum precursor in gas communication with the reaction chamber; a source of nitrogen precursor in gas communication with the reaction chamber; and a source of dopant precursor in gas communication with the reaction chamber. The batch reactor may further comprise a controller configured to control a timing and a sequence of the aluminum precursor, the nitrogen precursor, and the dopant precursor to the substrate upon retention of the substrate in the reaction chamber. The controller may be programmed to implement a plurality of aluminum and nitrogen deposition cycles to deposit an AlN film. Each cycle may comprise exposing a substrate disposed in the reaction chamber to a first aluminum precursor from the first source of aluminum precursor; and subsequently exposing the substrate to the nitrogen precursor. The controller may also be configured to expose the substrate to a dopant precursor. Without being limited by theory, such exposure may decrease crystallinity of the AlN film, which can have various advantages for, e.g., use of the resulting doped AlN film as a hardmask.

DETAILED DESCRIPTION

Figure 1:
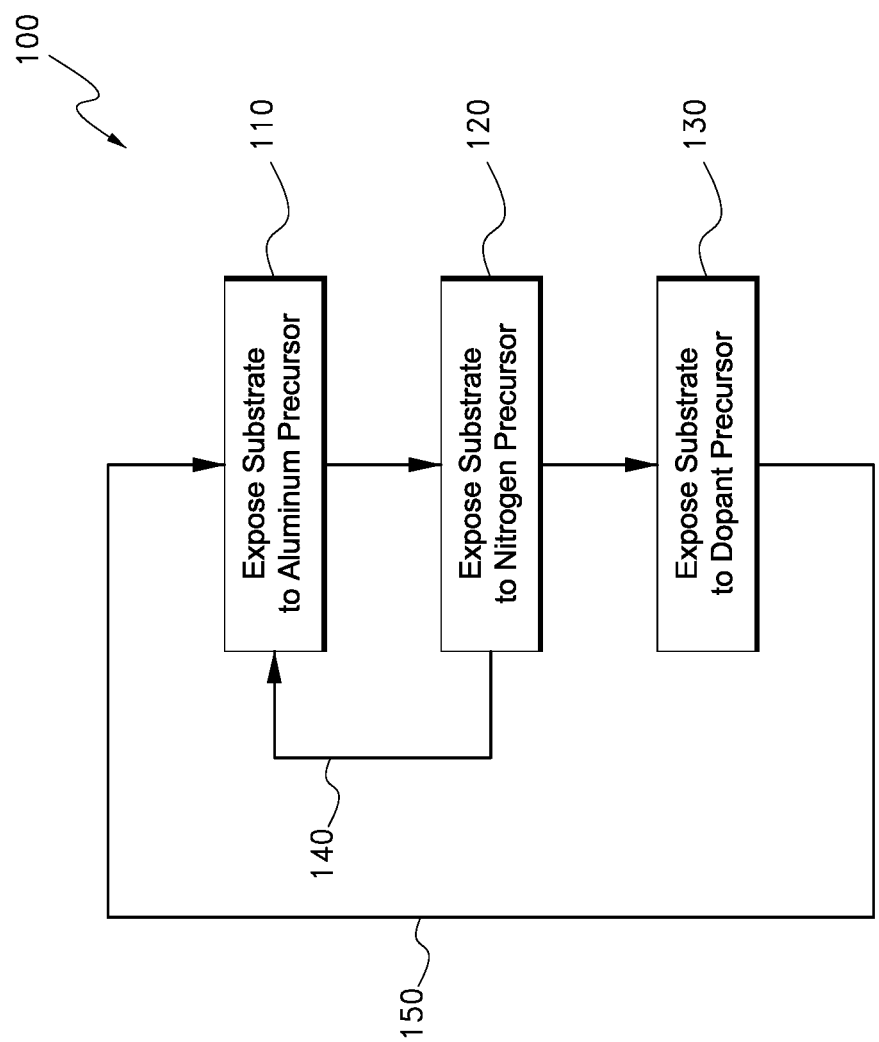
FIG. 1 is a flow chart generally illustrating a process for forming a doped AlN film, according to some embodiments.

It has been found that the incorporation of dopants, such as oxygen, into an AlN layer can advantageously form a doped AlN film with superior properties relative to AlN only films. As used herein a "doped AlN" film comprises the elements aluminum, nitrogen, and a dopant. The relative ratios of these elements may be varied, as disclosed herein, to adjust the physical and electrical properties of the doped AlN film. As such, it would be understood that an "AlN" film, or an "AlXN" film, in which "X" refers to a dopant, does not necessarily connote a particular stoichiometry of aluminum, nitrogen, and/or dopant. Example dopants for a doped AlN film in accordance with some embodiments include, but are not limited to oxygen, carbon, silicon, germanium, boron, phosphorus, sulfur, and combinations thereof. In some embodiments, where oxygen is used as the dopant, such a doped AlN film may also be referred to as an aluminum oxynitride (AlON) film. As used herein, an "AlON" film is formed of the elements aluminum, oxygen, and nitrogen.

In some embodiments, the doped AlN film is amorphous. Without being limited by theory, as a discussed further herein, the dopant may decrease the crystallinity of the AlN, thereby forming an amorphous AlN-containing film. Advantageously, such a doped, amorphous AlN film may function as a superior hard mask, and may form patterns with lower edge roughness, relative to undoped AlN hard mask films. Moreover, without being limited by any theory, it is contemplated that for underlying layers formed of relatively soft materials (e.g., photoresist), stress in an overlying layer (such as a hardmask) can cause deformities in features in the underlying layer. For example, the underlying material may be photoresist that has been patterned. The patterned features may be referred to as mandrels, and may be deformed by a high stress AlN hard mask. Advantageously, a low stress doped AlN film may be deposited as a conformal spacer layer on the sidewalls and tops of the mandrels. In some embodiments, the AlN spacer layer may then be directionally etched to leave spacers at the sides of the mandrels and the mandrels may then be removed to form an etch mask formed by the spacers. Thus, in some embodiments, after forming the doped AlN film, the film is patterned, and the pattern is then transferred to an underlying substrate.

To form the doped AlN film, in some embodiments, a substrate is subjected to temporally separated exposures to an aluminum precursor and a nitrogen precursor to deposit a film formed of an aluminum and nitrogen-containing compound (e.g., AlN) on the substrate. The aluminum and nitrogen-containing compound is subsequently exposed to a dopant precursor to form doped AlN. It will be appreciated that a dopant precursor is a chemical species that includes the dopant before incorporation into the deposited AlN film. In some embodiments, the exposure to the dopant precursor may include temporally separated exposures to an aluminum precursor and the dopant precursor (e.g., as noted herein, an oxygen, carbon, silicon, germanium, boron, phosphorous, sulfur precursor, and combinations thereof). The temporally separated exposures to an aluminum precursor and a nitrogen precursor, and the subsequent exposure to a dopant precursor together constitute a doped AlN deposition cycle. A plurality of doped AlN deposition cycles may be performed to deposit a doped AlN film of a desired thickness. The resulting doped AlN film may also be referred to as, for example, an AlON, AlCN, AlSiN, AlGeN, AlBN, AlPN, or AlSN film.

The AlN deposition may be performed in a batch process chamber, which may accommodate batches of 25 or more substrates. Preferably, the deposition is a non-plasma deposition, performed without exposing the substrate to plasma during the deposition. It is noted that a non-plasma doping can be advantageous for conformal doping of the deposited material. In some embodiments, thermal (non-plasma) doping is performed in a batch reactor. Optionally, plasma doping can also be suitable in some embodiments.

It will be appreciated that the exposure of the substrate to aluminum and nitrogen precursors before exposure to the dopant precursor effectively allows the formation of an AlN film, which is then exposed to the dopant precursor to form doped AlN. Without being limited by theory, it is believed that the reverse order (exposure to dopant precursor before exposure to nitrogen precursor) may form complexes of aluminum and dopant (e.g., AlO in the case of oxygen as the dopant) first in some instances, which would make incorporation of nitrogen difficult, due to the higher strength of the Al-dopant bond (e.g., Al—O) relative to the Al—N bond. Nitrogen-precursor exposure before dopant-precursor exposure is believed to facilitate the formation of advantageously relatively high amounts of nitrogen in the doped AlN film. In some embodiments, as discussed herein, before the exposure to the dopant precursor, a plurality of cycles of the temporally separated exposures to an aluminum precursor and a nitrogen precursor are performed. The amount of dopant in the doped AlN film may be adjusted by changing the ratio of the dopant precursor exposures to the cycles of the temporally separated exposures to the aluminum precursor and the nitrogen precursor.

Figure 11:
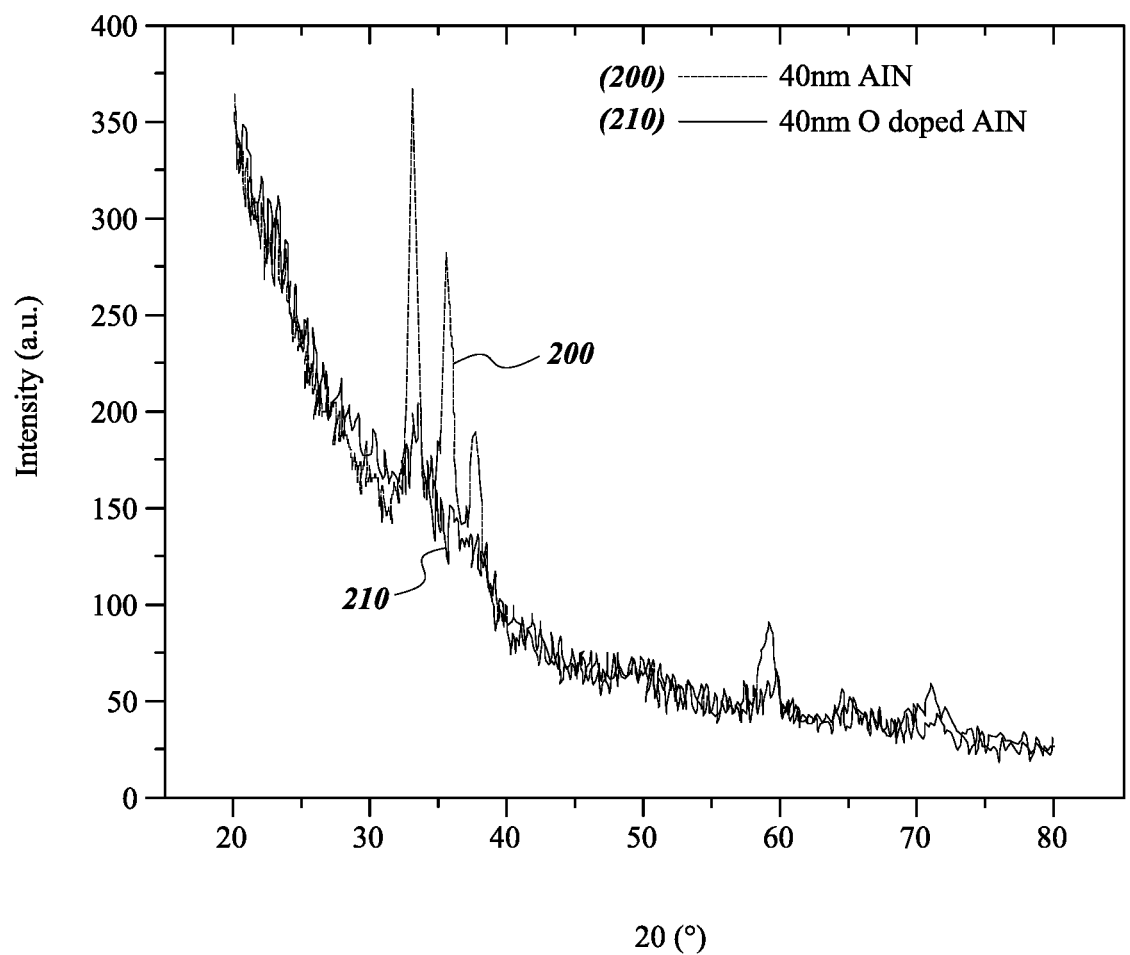
FIG. 11 is a chart showing the crystallinity of deposited doped AlN films, according to some embodiments.

Advantageously, the properties of the doped AlN film can be tuned by changing the amount of dopant in the doped AlN film, as discussed herein. For example, increasing the level of dopant in the doped AlN film can reduce film stress, refractive index, and leakage current density, and suppress crystallinity so as to form an amorphous film, which is more amorphous than the originally deposited AlN film. In some embodiments, the doped AlN film may have a film stress of about 800 MPa or less, about 200-700 MPa, or about 200-500 MPa. The AlON film may also have a low leakage current density, for example, a leakage current density of less than about $1 \times 10^{-7}$ A/cm$^2$ with an applied electric field of about 2 mV/cm, or less than about $1 \times 10^{-7}$ A/cm$^2$ with an applied electric field of about 5 mV/cm. In some embodiments, without being limited by any theory, the doped AlN film may be tuned to an increasingly amorphous and decreasingly crystalline morphology by increasing dopant content, which can provide relatively smooth edges when patterned, in comparison to undoped AlN, which tends to have a crystalline morphology, and relatively rough edges. The lower crystallinity caused by doping AlN may be seen in FIG. 11, in which plot 200 corresponds to an AlN film and plot 210 corresponds to an O-doped AlN film (that is, an AlON film).

In some embodiments, the low film stress allows the doped AlN (e.g., AlON) film to be deposited directly on a "soft" underlying material, such as photoresist. In some embodiments, the doped AlN film may be patterned and retained as a constituent part of a final integrated circuit device. In some embodiments, the doped AlN film may be used as a hard mask. In this regard, the doped AlN film provides excellent etch selectively over materials that are easily etched with fluorine-based chemistries, with the high proportion of nitrogen in the film allowing a high resistance of the doped film against fluorine-based etch chemistries. Moreover, in addition to possessing excellent etch selectivity in hard mask applications, the doped AlN film can form smooth edges after being patterned and these smooth edges, in turn, can yield excellent results when transferring a pattern to an underlying substrate. In contrast, in pattern transfer applications where an underlying substrate is etched through a patterned AlN hardmask film, relatively rough edges in the patterned hardmask may be transferred to an underlying substrate, thereby resulting in undesirably rough edges in the features etched into substrate. A hard mask with smooth edges, however, such as achieved with doped AlN films disclosed herein, can yield desirably smooth edges in the pattern formed in the underlying substrate. Additionally, as noted herein, a hard mask with low crystallinity, such as an amorphous hard mask comprising doped AlN in accordance with some embodiments herein can have low stress. This low stress may reduce the tendency of high stress hard masks to undesirably deform or bend an underlying mandrel. Advantageously, in some embodiments, the above-noted physical and electrical properties are present in the doped AlN film as deposited; for example, an anneal is not required to achieve these properties.

Reference will now be made to the Figures, in which like numerals refer to like features throughout.

FIG. 1 is a flow chart generally illustrating a process 100 for forming a doped AlN (e.g., AlON, AlCN, AlSiN, AlGeN, AlBN, AlPN, or AlSN) film, according to some embodiments. The process 100 is preferably performed in the process chamber of a batch reactor, which may accommodate a plurality of substrates, for example, 25 or more substrates, or 25 to 150 substrates. In some embodiments, the batch process chamber is a hot wall chamber, in which the walls of the chamber are actively heated to, e.g., a process temperature. As noted herein, such a hot wall process chamber may provide advantages for achieving uniform process results. The substrates processed in the batch process chamber may be any workpiece upon which doped AlN is to be deposited, including a workpiece formed of a semiconductor, such as a semiconductor wafer, which may include one or more overlying materials. Alternatively, the process may be performed in a hot wall single wafer reactor with similar results but with correspondingly lower throughput.

Before being exposed to deposition precursors, a plurality of substrates is loaded into the batch process chamber. The substrates may be heated to a deposition temperature of about 400° C. or less, about 150° C. to about 375° C., about 240° C. to about 375° C., or about 300° C. to about 375° C. In addition, a deposition pressure may be established in the batch process chamber, the deposition pressure being about 50 mTorr to about 900 mTorr, about 100 mTorr to about 700 mTorr, or about 150 mTorr to about 550 mTorr.

At block 110, the substrate may be exposed to an aluminum precursor, for example, in an aluminum precursor pulse. In some embodiments, exposure of the substrate to the aluminum precursor (e.g., the flow of the aluminum precursor into the process chamber) starts at the beginning of the pulse and terminates at the end of the pulse. In some embodiments, the pulse duration may be about 1 seconds or more, about 1 second to about 20 seconds, about 2 seconds to about 20 seconds, about 3 seconds to about 16 seconds, or about 5 seconds to about 10 seconds. Without being limited by theory, it is believed that durations on the order of seconds, including 2 or 3 seconds or more, are desirable to achieve a high level of self-limiting coverage of a substrate surface with the aluminum precursor. However, excessively long durations may result in reaction of individual aluminum precursor molecules with other aluminum precursor molecules, causing an undesired non-self-limiting deposition. The aluminum precursor pulse duration may be less than about 20 seconds, or less than about 16 seconds, or about 7 seconds in some embodiments.

Examples of aluminum precursors include organic aluminum precursors, such as alkyl aluminum compounds and alkyl-substituted aluminum chloride compounds, and alkyl-substituted aluminum hydride compounds. The organic aluminum precursor may have the formula $AlR_3$, wherein the R is selected from substituted, branched, linear or cyclic C1-C10 hydrocarbons. In some embodiments 0-3 of the R groups are methyl and the rest are ethyl. In some embodiments, the organic aluminum precursor may be trimethylaluminum (TMA). In some embodiments, the aluminum precursor has both a halide ligand and organic ligand, for example $AlR_xX_{3-x}$, wherein x is from 1 to 2 and R is organic ligand, such as alkyl or alkenyl and X is halide, such as chloride. Examples of this kind of aluminum precursor might be, for example, dimethylaluminumchloride $(CH_3)_2AlCl$. In some other embodiments the aluminum precursor is an Al halide, such as $AlCl_3$ or $AlI_3$.

After terminating the aluminum precursor pulse, at block 120, the substrate may be exposed to a nitrogen precursor in a nitrogen precursor pulse. Examples of nitrogen precursors include ammonia, hydrazine, and hydrazine derivatives. In some embodiments, exposure of the substrate to the nitrogen precursor (e.g., the flow of the nitrogen precursor into the process chamber) starts at the beginning of the pulse and completely terminates at the end of the pulse. In some embodiments, the pulse duration may be about 1 second or more, or about 10 seconds or more. In some embodiments, the pulse duration may be about 1 second to about 90 seconds, about 10 second to about 90 seconds, or about 20 seconds to about 60 seconds. Without being limited by theory, it believed that durations of about 10 seconds or more desirably allow the nitrogen precursor to fully react with the aluminum precursors on the substrate surface. Longer durations can increase the deposited film thickness.

With continued reference to FIG. 1, the blocks 110 and 120 constitute a deposition cycle 140. The deposition cycle may be repeated a plurality of times to form an aluminum nitride (AlN) film of a desired thickness. It will be appreciated that the film may completely cover the substrate, or may be localized at discrete locations on the substrate, depending on, for example, the reactivity of the aluminum precursor with different regions on the substrate surface.

It will be appreciated that the cycle 140 can include one or more precursor removal steps (not illustrated). For example, between blocks 110 and 120, aluminum precursor can be removed or purged from the proximity of the substrate by, e.g., flowing inert gas into the process chamber without flowing precursor species and/or by evacuating the process chamber to remove the aluminum precursor from the chamber.

Similarly, after block 120 and before again exposing the substrate to aluminum precursor, the nitrogen precursor can be removed from the proximity of the substrate. This may also be accomplished by, e.g., flowing inert gas into the process chamber without flowing precursors species and/or by evacuating the process chamber to remove the nitrogen precursor from the chamber. Thus, in some embodiments, an AlN deposition cycle 140 may include:

Exposing substrate to an aluminum precursor pulse;
Removing the aluminum precursor from the process chamber;
Exposing substrate to a nitrogen precursor pulse; and
Removing the nitrogen precursor from the process chamber.

The precursor removal times for the aluminum and nitrogen precursors may be the same or different. In some embodiments, the aluminum precursor purge time is about 1 to about 7 seconds and the nitrogen precursor purge time is about 7 to about 30 seconds, or about 7 to about 15 seconds. It has been found that the duration of the aluminum precursor purge does not strongly influence film uniformity, but the duration of the nitrogen precursor purge does more strongly influence film uniformity. In some embodiments, the duration of the nitrogen precursor purge is at least about 1.5, about 2, or about 3 times the duration of the aluminum precursor purge.

As noted herein, the deposition cycles can be repeated to form an AlN film of a desired thickness. In some embodiments, all cycles may be performed under the same conditions, e.g., the same deposition temperature and/or pressure. In some other embodiments, the conditions for performing a first set of one or more deposition cycles during a first time period can be different from the conditions for performing a second set of one or more deposition cycles during a second time period.

In some embodiments, the deposition temperature for a first set of AlN deposition cycles is higher than for a second set of deposition cycles. Without being limited by theory, it is believed that the deposition rate of the AlN film is strongly dependent upon the surface that the film is deposited upon. It has been found that the AlN film deposition rate increases after performing an initial set of deposition cycles and it is believed that this lower initial rate is due to the presence of an inhibition period which disappears once a closed AlN film is formed on the substrate surface. Increasing the deposition temperature during this inhibition period can increase the deposition rate, while maintaining high film uniformity. In some embodiments, the deposition temperature during a first period of performing the deposition cycles is at least about 25° C. higher, at least about 25° C. to about 75° C. higher, or at least about 25° C. to about 50° C. higher than the deposition temperature during a subsequent period of performing the deposition cycles. In some embodiments, the deposition temperature during the first period is about 350° C.±about 25° C., or about 350° C.±about 10° C., and the deposition temperature during the second period is about 300° C.±about 25° C., or about 300° C.±about 10° C. In some embodiments, the first period may include about 10 or more deposition cycles, about 10 to about 50 deposition cycles, or about 20 to about 40 deposition cycles.

It has also been found that the AlN deposition rate becomes less influenced by the pulse duration of the nitrogen precursor after passing the inhibition period. In some embodiments, the nitrogen precursor pulse duration can decrease over time. For example, nitrogen precursor pulse durations in the first period of performing the deposition cycles can be higher than in the second period, e.g., the period after passing the inhibition period. For example, the nitrogen precursor pulses times during the first period may be about 10 seconds or more, falling to about 3 to about 10 seconds or about 3 to about 5 seconds in the second period.

Advantageously, AlN films deposited according to some embodiments can have exceptional uniformity across a substrate, which facilitates the ultimate formation of a highly uniform doped AlN film. In some embodiments, a film non-uniformity of $1\sigma=1\%$ or better, $1\sigma=0.5\%$ or better, or $1\sigma=0.25\%$ or better is achieved across the substrate.

With continued reference to FIG. 1, at block 130, the substrate may be exposed to a dopant precursor. Example dopants include oxygen, carbon, silicon, boron, phosphorus, arsenic [[PLEASE CONFIRM IF IT WOULD MAKE SENSE TO INCLUDE ARSENIC]], sulfur, and germanium-containing species. Examples of oxygen dopant precursors include water (e.g., water vapor), oxygen gas, ozone, and $O_2$ plasma. Examples of carbon dopant precursors include $CH_4$ (methane), tetramethyl silane ($Si(CH_3)_4$), trimethylsilane ($Si(CH_3)_3$), $C_2H_4$ (ethylene), Benzene ($C_6H_6$), and $C_2H_2$. Example silicon dopant precursors include MO Si precursors (e.g., hexakis ethylamino-disilane) and halides ($SiCl_4$, $SiI_4$). Example boron dopant precursors include $BCl_3$ and $B_2H_6$. Example phosphorous dopant precursors include $PH_3$. Example sulfur dopant precursors include $H_2S$ and $NH_4S$. Example germanium precursors include $GeH_4$ and $Ge_2H_6$. Example arsenic dopants include $AsH_3$ (Arsene). In some embodiments, the substrate is exposed to a pulse of a dopant precursor. In some embodiments, exposure of the substrate to the dopant precursor (e.g., the flow of the dopant precursor into the process chamber) starts at the beginning of the pulse and terminates at the end of the pulse. In some embodiments, the pulse duration may be about 1 second or more, or about 10 seconds or more. In some embodiments, the pulse duration may be about 1 second to about 90 seconds, about 3 second to about 60 seconds, or about 3 seconds to about 30 seconds. As an example of oxygen precursor, when using ozone, the pulse duration may be between 1 and 30 seconds, and in an example process a pulse duration of 5 seconds was used. It will be appreciated that reactive species may removed from the process chamber after block 130. The removal may be accomplished by evacuation of the process chamber and/or flowing purge gas through the process chamber. In some embodiments, for example when the dopant comprises oxygen, at least a minimum thickness of AlN is deposted before oxidation so that at least a portion of the deposited AlN is not completely oxidized.

Figure 2:
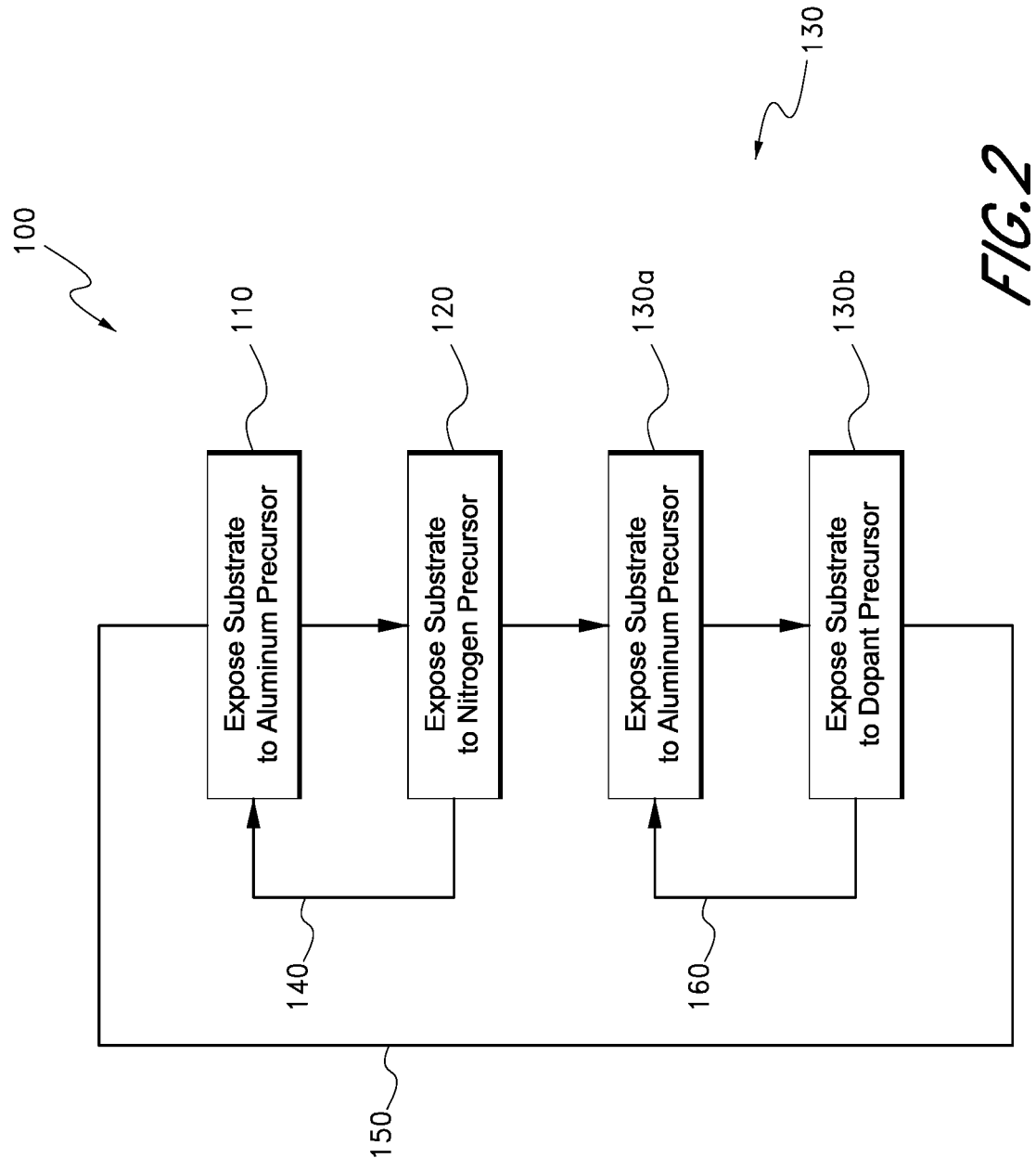
FIG. 2 is a flow chart generally illustrating a process for forming a doped AlN film, according to some other embodiments.

With reference to FIG. 2, the provided flow chart generally illustrates a process for forming a doped AlN film according to some other embodiments. FIG. 2 is similar to FIG. 1, except for the dopant exposure block 130. As illustrated, exposing the substrate to a dopant precursor may involve exposing the substrate to the dopant precursor as part of a doped Al deposition cycle. Thus, the block 130 may include a block 130a in which the substrate is exposed to an aluminum precursor, and a subsequent block 130b in which the substrate is exposed to the dopant precursor. The aluminum precursors and related pulse details may be as discussed above regarding block 110 in FIG. 1. The dopant precursors and related pulse details may be as discussed above regarding block 130 in FIG. 1. In some embodiments, the same precursors are used throughout the deposition 100, including for example using the same aluminum precursor during blocks 110 and 130a. In some other embodiments, it is contemplated that the precursor used to provide a particular element may change over the course of the deposition. It will be appreciated that precursors may be removed from the process chamber after blocks 130a and 130b. The removal may include evacuation of the process chamber and/or flowing purge gas through the process chamber. As illustrated, the exposure to the aluminum precursor at block 130a and the exposure to the dopant precursor at block 130b constitute a doped Al deposition cycle 160, which may be repeated in some embodiments. For example, the doped Al deposition cycle 160 may be performed 1, 2, 3, or 4 times per doped AlN deposition cycle 150.

It will be appreciated that the AlN deposition cycles 140 and the subsequent dopant exposure at block 130 may be repeated to deposit a doped AlN film of a desired thickness. For example, doped AlN films of a desired thickness can be deposited. The AlN deposition cycles 140 and the dopant exposure at block 130 may be referred to together as an AlN deposition cycle. In some embodiments, 10 or more, 20 or more, 50 or more, or 100 or more doped AlN deposition cycles may be performed. It will be appreciated that where the dopant exposure 130 includes the doped Al deposition cycles 160, the doped Al deposition cycles 160 and the AlN deposition cycles 140 form a laminate of AlN and doped Al sublayers, which form a doped AlN film in the aggregate.

As discussed herein, the ratio of the block 130 dopant exposures (e.g., exposure to one or more of oxygen, carbon, silicon, boron, phosphorus, sulfur, and germanium dopant precursor) to the AlN deposition cycles 140 may be varied to tune the properties of the resulting doped AlN film. It is contemplated, for example, that the etch resistance of the doped AlN film can depend on the dopant content. As such, in some embodiments, the amount of dopant in the as-deposited doped AlN film can be tailored, so as to change the etch selectivity of the hard mask relative to other materials when exposed to different etchants. The amount of dopant can be tailored based on the ratio of doped Al cycles 160 to AlN deposition cycles 140. For example, the ratio of doped Al cycles 160 to AlN deposition cycles 140 can be about 1:2 or lower, 1:3 or lower, 1:6 or lower, 1:10 or lower, 1:20 or lower, or 1:40 or lower It is noted that the suitability of certain ratios can depend on the etch chemistry of interest, and that the ratios may be adjusted in view of parameters including, e.g., the chemical precursors used to deposit the doped AlN, the incorporation rate of the dopant, and effects of incorporated dopant concentrations on etch selectivity, stress, and other aspects of the deposited material. In some embodiments, a desired dopant content is selected, and the ratio of doped Al cycles 160 to AlN deposition cycles 140 is selected based on the desired dopant content. It has been found that AlN is prone to oxidation where oxygen dopant is utilized at block 130 and, at ratios of more than about 1:6, the AlN film may be converted to a film that is substantially AlO. Consequently, to form an AlON film, the ratio of the block 130 oxygen exposures to the AlN deposition cycles 140 (block 130:block 140) is preferably about 1:6 or less, including about 1:10 or less. It will be appreciated that, by varying the ratio of the block 130 oxygen exposures to the AlN deposition cycles 140, the ratio of oxygen exposures to nitrogen exposures can effectively be set. It will be appreciated that these ratios apply to the embodiments of both FIGS. 1 and 2. For example, the ratio of doped Al cycles 160 to AlN cycles 140 is preferably about 1:6 or lower, or about 1:10 or lower in some embodiments.

Figure 3:
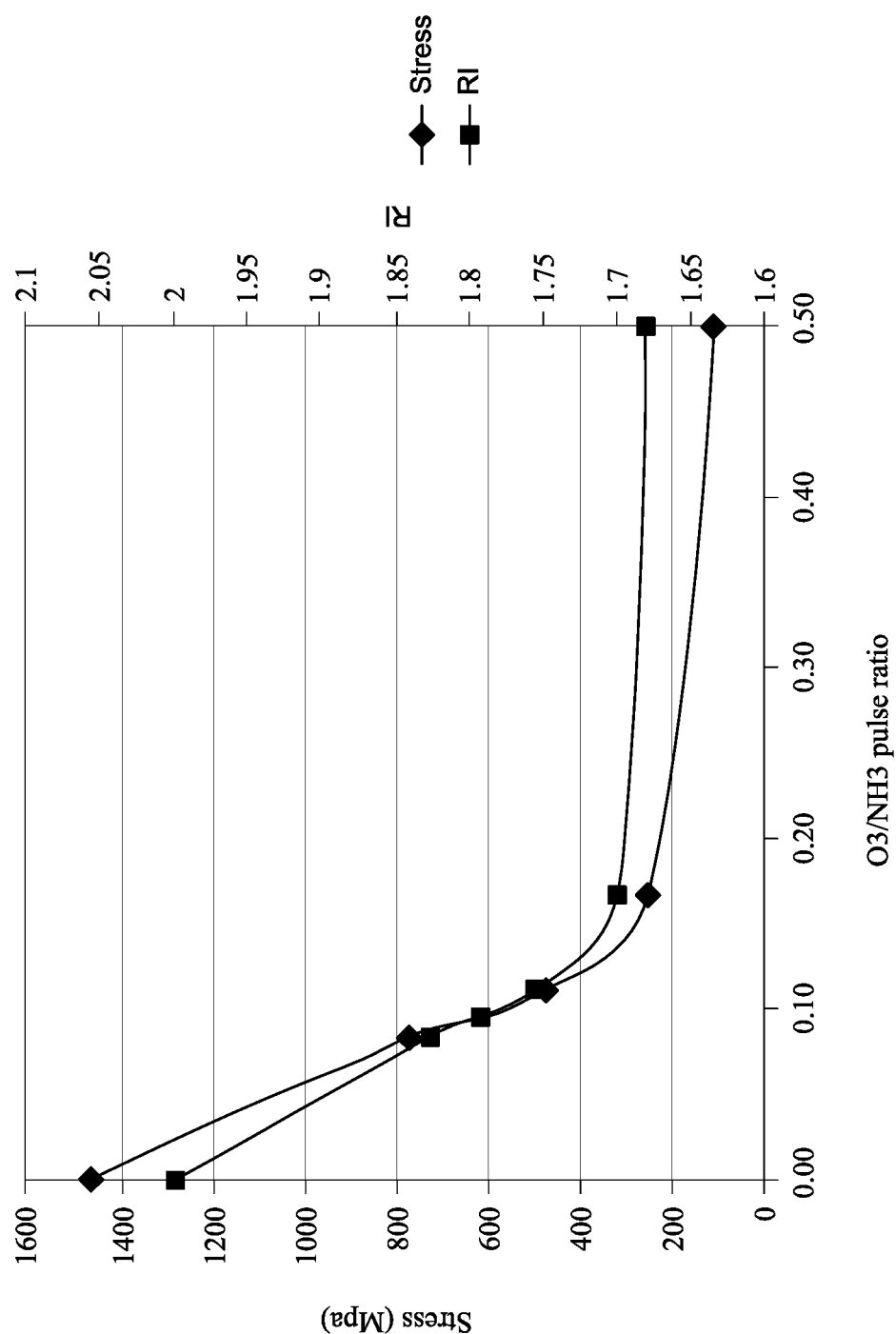
FIG. 3 is a chart showing film stress and refractive index as a function of oxygen to nitrogen precursor ratio, according to some embodiments.

Advantageously, varying these ratios allows the properties of the doped AlN film to be tuned. For example, the refractive index, phase, stress, and current leakage of the film may be adjusted. FIG. 3 is a chart showing film stress and refractive index as a function of oxygen to nitrogen precursor ratio, according to some embodiments. The incorporation of oxygen in the AlON film decreased both film stress and refractive index. As illustrated, film stress and refractive index were found to decrease with increasing ratios of oxygen precursor exposures to nitrogen precursor exposures. As such, in some embodiments, the film stress and/or refractive index is tuned to a desired level via the ratio of doped Al cycles 160 to AlN cycles 140. In some embodiments, the film stress is about 800 MPa or less, about 700-100 MPa, or about 500-100 MPa for AlON layers with a thickness of about 20 nm.

Figure 4:
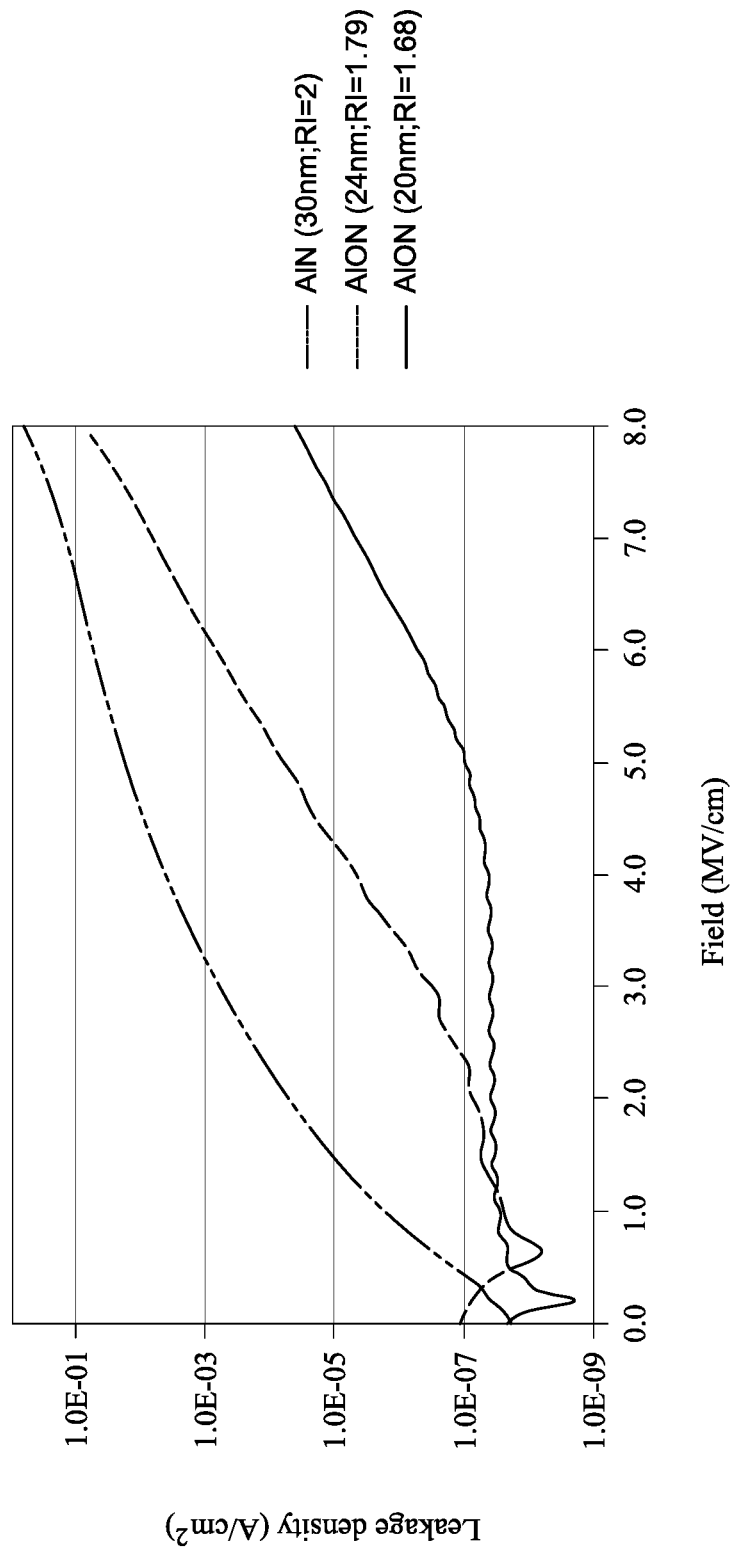
FIG. 4 is a chart showing leakage current density as a function of applied electric field, according to some embodiments.

FIG. 4 is a chart showing leakage current density as a function of applied electric field, according to some embodiments. The doped AlN films (AlON films, in this case) were formed using AlN and AlO deposition cycles as described herein. TMA was the aluminum precursor, ammonia was the nitrogen precursor, and ozone was the oxygen precursor. The lines corresponding to RI=1.79 and RI=1.68 show the leakage current for an AlON film formed using ratios of AlO to AlN deposition cycles of 2:21, and 2:12, respectively. As illustrated, it was found that the incorporation of oxygen in an AlON film caused a decrease in leakage current density relative to an AlN film. In addition, increasing levels of oxygen incorporation, as determined based on the ratio of oxygen precursor exposure to nitrogen precursor exposure, were found to decrease leakage current density. For example, a leakage current density of less than about $1 \times 10^{-7}$ A/cm$^2$ with an applied electric field of about 2 mV/cm was achieved with a ratio of 1:10 or lower, and a leakage current density of about $1 \times 10^{-7}$ A/cm$^2$ with an applied electric field of about 4 mV/cm was achieved with a ratio of 1:6 or lower.

In addition, the dopant in the doped AlN film (e.g. oxygen in an AlON film, or any of the dopants described herein in the corresponding doped film) can suppress crystallinity, thereby allowing formation of an amorphous doped AlN film. It will be appreciated that the fraction of the doped AlN film that is crystalline can increase with increasing thickness. The incorporation of dopant (e.g. oxygen, carbon, silicon, boron, phosphorus, sulfur, and/or germanium) in the film allows the formation of relatively thick doped AlN layers that are amorphous.

Advantageously, the tunability of doped AlN film allows the film to be used in various applications. For example, the low stress of the doped AlN film (e.g, AlON) allows the film to be deposited on relatively weak, or soft, materials. Examples of such soft materials include materials deposited by spin-coating, such as photoresist. Advantageously, the low stress allows the doped AlN film to be deposited on the underlying material, without, e.g., delaminating.

The doped AlN film can provide excellent etch selectivity, with a low etch rate when exposed to fluorine-based etch chemistries. In some embodiments, the etch rate of the doped AlN film when exposed to fluorine-based etch chemistries is between that of aluminum nitride and aluminum oxide. Advantageously, the doped AlN film can be utilized as a hard mask. In some applications, the doped AlN film may be an etch stop, such as when fluorine-based etch chemistries are used to etch overlying materials. In some applications, the doped AlN film may be patterned and then used as an etch mask to pattern underlying material. Advantageously, in some embodiments, the doped AlN film may be retained as part of a final integrated circuit structure. For example, the doped AlN film (e.g., AlON) may be used as a dielectric film in the integrated circuit. In an embodiment, the ratio of dopant exposures to AlN deposition cycles may be varied during the film deposition process. For example, during the initial phase of the deposition process on a relatively soft material (e.g., photoresist), a relatively high ratio of dopant exposures (e.g. oxygen, carbon, silicon, boron, phosphorus, sulfur, and/or germanium precursor exposures), relative to the dopant exposures during the final phase below, may be applied resulting in an dopant-rich film having a low stress, whereas during a final phase of the film deposition process a relatively low ratio of dopant exposures, also referred to as "doped Al cycles" (relative to the dopant exposures during the initial phase above) may be applied, resulting in an dopant-poor film having a low etch rate when exposed to fluorine-based etch chemistries. For example, a relatively high ratio of oxygen exposures in an initial phase relative to oxygen exposures in the final phase can be applied, resulting in an oxygen poor-film having a low etch rate when exposed to fluorine-based etch chemistries. Thus, the dopant content can be tuned based upon the subsequent etch chemistry so as to achieve a suitable level of etchant resistance for those surfaces that will contact the etchant.

As noted above, the doped AlN deposition 100 (FIGS. 1 and 2) is preferably a thermal deposition in which the deposition is performed without exposing the substrate to plasma. Advantageously, by not exposing the film to plasma, electrical defects, such as trapped charges, can be avoided.

The thermal deposition of the doped AlN film includes the thermal deposition of AlN, without the use of plasma during the deposition. The thermal deposition of AlN has been considered challenging. Thermal deposition of AlN has been suggested by T. M. Mayer, J. W. Rogers and T. A. Michalske, Chem. Mater. 1991, 3, 641-646, "Mechanism of Nucleation and Atomic Layer Growth of AlN on Si"). However, attempts at atomic layer deposition of AlN films have not provided deposited films that are uniform across a substrate, even in state-of-the-art single wafer reactors used in the semiconductor processing industry. Thus, these thermal depositions have been considered unsuccessful due to the unacceptably poor film uniformities that are produced.

Without being limited by theory, it is believed that the above-noted attempts at atomic layer deposition produced non-self-limiting and uncontrolled deposition over at least some parts of the substrate, thereby causing large variations in film thickness across the substrate. Thus, while atomic layer growth having a roughly monolayer by monolayer deposition of AlN was desired, the depositions appeared to in fact contain a strong chemical vapor deposition component in which film growth was not self-limited. As a result, the controllability of the thermal deposition has been considered poor and insufficient for depositions across a substrate, particularly in comparison to results achievable with plasma-assisted depositions.

Without being limited by theory, it is believed that the deposition pressures typically utilized in single wafer reactors may encourage undesired reactions between aluminum precursors, thereby causing non-self-limited deposition of aluminum on a substrate. Typical single wafer reactor deposition pressures may be in the range of 1 to 10 Torr. According to some embodiments, the deposition pressure is about 50 mTorr to about 900 mTorr, about 100 mTorr to about 700 mTorr, or about 150 mTorr to about 550 mTorr, which may reduce the non-self-limiting component of the AlN deposition. In conjunction with relatively long precursor pulse durations of, e.g., 1 or 3 seconds or more, the low pressures allow good saturation of the substrate surface with the precursor, while providing low levels of non-self-limited deposition. It will be appreciated that absorbed precursors on the walls or incompletely reacted deposits on the walls of the process chamber can adversely affect the deposition and may generate contaminants. Without being limited by theory, it is believed that the use of a hot wall batch process chamber can reduce the amount of poor quality deposits on the chamber walls, thereby improving the quality of films deposited on the substrates.

Reactors according to some embodiments can be configured to perform the processes described herein. The reactor can be configured to deposit an amorphous doped AlN as described herein (e.g., an AlON, AlCN, AlSiN, AlGeN, AlBN, AlPN, or AlSN). The reactor can comprise a batch reactor. In some embodiments, the reactor may be configured to perform any of the processes described herein to deposit doped AlN. In some embodiments, the reactor is configured to perform a sequence of exposing a substrate to aluminum, nitrogen, and dopant precursors as illustrated and described with reference to FIG. 1. In some embodiments, the reactor is configured to perform a sequence of exposing a substrate to aluminum, nitrogen, and dopant precursors as illustrated and described with reference to FIG. 2. In some embodiments, the reactor comprises a reaction chamber. The reaction chamber can be in gas communication with a source of Aluminum precursor (e.g., TMA or TEA). The reaction chamber can also be in gas communication with a source of Nitrogen precursor (e.g., $NH_3$). The reaction chamber can be in gas communication with a source of dopant precursor (e.g., oxygen precursor, carbon precursor, silicon precursor, germanium precursor, boron precursor, phosphorus precursor, sulfur precursor, and combinations thereof). The reactor can further comprise a controller. The controller can be in electrical communication with the reaction chamber so as to control the timing and sequence of exposure to the aluminum precursor, nitrogen precursor, and/or dopant precursor, for example via wireless and/or wired data communication. For example, the controller can be in data communication with valves, injectors, or the like configured to provide the indicated precursors to the chamber, and/or a purge system configured to purge the chamber. The controller can be configured to implement a program for forming an amorphous doped AlN film on a substrate in the reaction chamber as described herein. The program can instruct the reactor to perform one or more cycles of exposing the substrate to aluminum precursor from the source of aluminum precursor followed by exposing the substrate to nitrogen precursor from the source of nitrogen precursor, so as to form an AlN film on the substrate. Optionally, the program can instruct the reactor to perform a plurality of cycles of exposing the substrate Aluminum precursor and exposing the substrate to nitrogen precursor. The program can further instruct the reactor to decrease a crystallinity of the AlN film by doping the AlN film. In some embodiments, doping the AlN film comprises exposing the AlN film to a dopant precursor, for example an oxygen precursor, carbon precursor, silicon precursor, germanium precursor, boron precursor, phosphorus precursor, or sulfur precursor, or a combination thereof. In some embodiments, doping the AlN film comprises exposing the AlN film to an aluminum precursor; and subsequently exposing the substrate to a dopant precursor. In some embodiments, the reaction chamber comprises a single area for reactions to occur. In some embodiments, the reaction chamber comprises two or more different areas for reaction to occur. In some embodiments, the two or more different areas are in gas communication with each other. In some embodiments, the two or more different areas are not in gas communication with each other.

Figure 12:
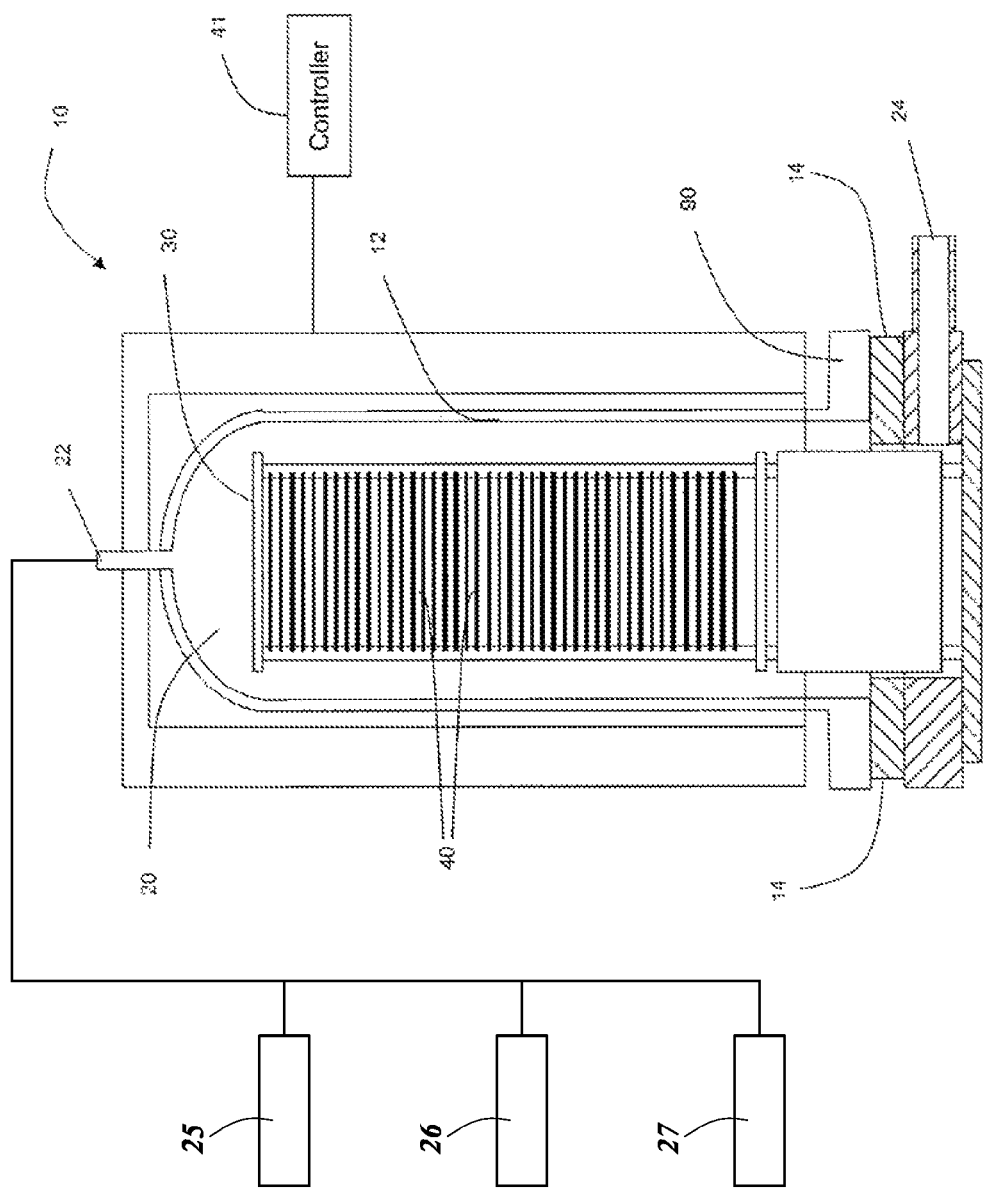
FIG. 12 is a diagram of a reactor, according to some embodiments.

With reference to FIG. 12, the illustrated reactor 10 is a vertical furnace reactor, which accommodates substrates 40 vertically separated from one another and which has benefits for efficient heating and loading sequences. Examples of suitable vertical furnaces are the A400™ and A412™ vertical furnaces, commercially available from ASM International, N.V. of Bilthoven, the Netherlands. It will be understood, however, that while preferred embodiments are presented in the context of a vertical batch furnace, the principles and advantages disclosed herein will have application to other types of reactors, some of which are further discussed herein.

With continued reference to FIG. 12, a tube 12 defines a reaction chamber 20 in the interior of the vertical furnace or reactor 10. The lower end of the tube 12 terminates in a flange 90, which mechanically seals the chamber 20 by contact with a lower support surface 14. Process gases can be fed into the reaction chamber 20 through a gas inlet 22 at the top of the chamber 20 and evacuated out of the chamber 20 through a gas outlet 24 at the bottom of the chamber 20. The gas inlet 22 may be in selective gas communication with a source 25 of aluminum precursor, a source 26 of nitrogen precursor, and a source 27 of dopant precursor. The reaction chamber 20 accommodates a wafer boat 30 holding a stack of vertically spaced substrates or wafers 40. The reactor further comprises a controller 41. The controller 41 can be in data communication with the reaction chamber 20, for example via wired and/or wireless communication. The controller 41 can be configured with a program to instruct the reactor to implement the steps of any of the processes described herein for deposing amorphous doped AlN. The timing and sequence of precursors, among other process parameters can be programmed into the controller 41. In some embodiments, a program to implement the process of FIG. 1 is programmed into the controller 41. In some embodiments, a program to implement the process of FIG. 2 is programmed into the controller 41.

The deposition of doped AlN films in a batch reactor was investigated and is discussed below. Advantageously, the deposition of highly uniform AlN films advantageously allows for the formation of highly uniform doped AlN films.

Examples

AlN films were deposited in a A412 vertical furnace commercially available from ASM International, Versterkerstraat 4, 1322 AP Almere, the Netherlands. The furnace has a linerless process chamber, aluminum and nitrogen precursors were injected into the process chamber, each gas flowing through a separated multiple hole injector. Purge gas may be injected through the multiple hole injectors and/or through a "dump" injector, which is an injector tube without intermediate holes but having an open end near the top of the process tube. The gases are evacuated at the bottom of the process tube. Substrates are accommodated in a rack, or "boat," which may be rotated during depositions inside the process chamber. The process chamber is a hot wall chamber.

Trimethylaluminum (TMA) was used as the aluminum precursor and $NH_3$ as the nitrogen precursor. Unless otherwise specified, the depositions were performed at 350° C., 70 cycles of deposition were performed, boat rotation was applied, and the following cycle was performed:

|  | Flow rate, Gas flowed | Duration |
| --- | --- | --- |
| TMA pulse: | 0.4 g/min TMA | 7 s |
| TMA purge: | 5 slm $N_2$ | 7 s |
| $NH_3$ pulse: | 1 slm $NH_3$ | 30 s |
| $NH_3$ purge: | 5 slm $N_2$ | 30 s |

During the purge steps, the 5 slm $N_2$ was injected through the dump injector. Additional small $N_2$ flows were flown through the multiple hole injectors. The chamber pressure was not controlled but maximum pumping and evacuation of the chamber was simultaneously applied, resulting in a chamber pressure in a range of 150 to 550 mTorr. The pressure of 150 mTorr is the pressure during the precursor exposure steps and the pressure of 550 mTorr is the pressure during the purge steps.

Figure 5:
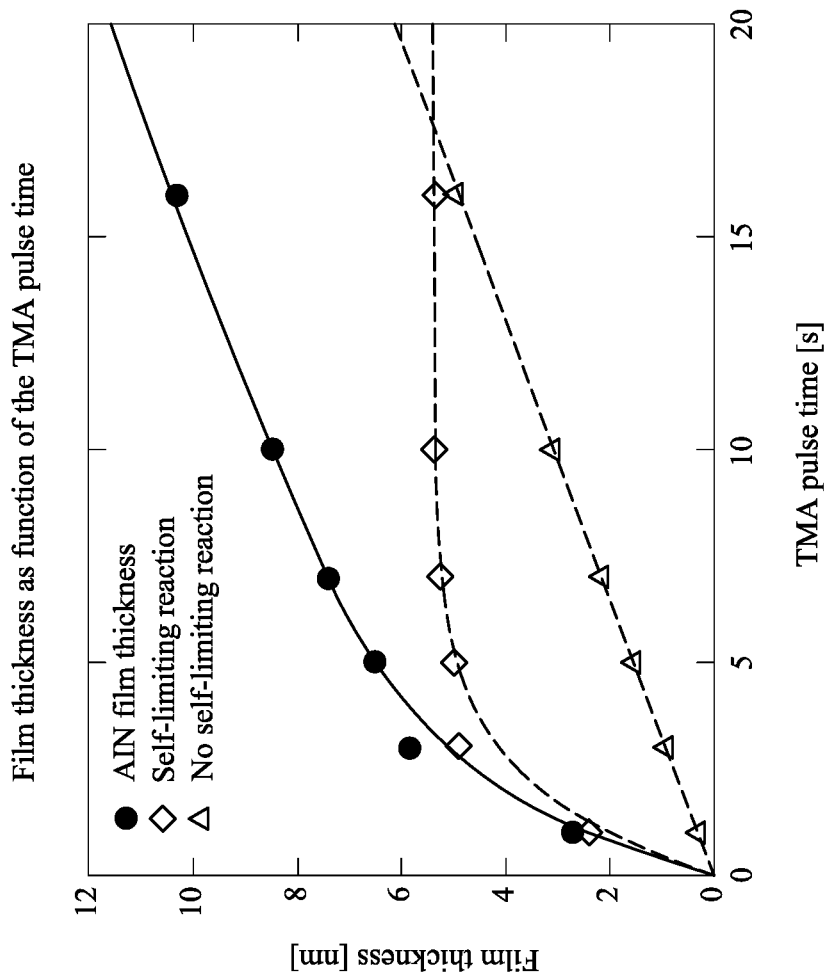
FIG. 5 is a chart showing deposited film thickness as a function of TMA pulse duration, according to some embodiments.

FIG. 5 is a chart showing deposited film thickness as a function of TMA pulse duration, for 70 cycles at a deposition temperature of 350° C. From the chart it can be observed that the film thickness did not saturate with increasing TMA pulse duration. Rather, increasing pulse durations provided increasing AlN film thicknesses. Thus, it is believed that the AlN deposition process is not completely self-limiting as would occur with pure ALD. Rather, the AlN deposition contains a self-limiting component (open diamonds) and a non-self-limiting component (open triangles). The self-limiting component is evident at a TMA pulse duration of 3 second or longer. For TMA pulse durations of 16 seconds, the contribution of the non-self-limiting component and the self-limiting component to the deposited film thickness are about equally large. A TMA pulse duration of about 7 seconds was found to provide good deposition rates and high uniformity.

Figure 6:
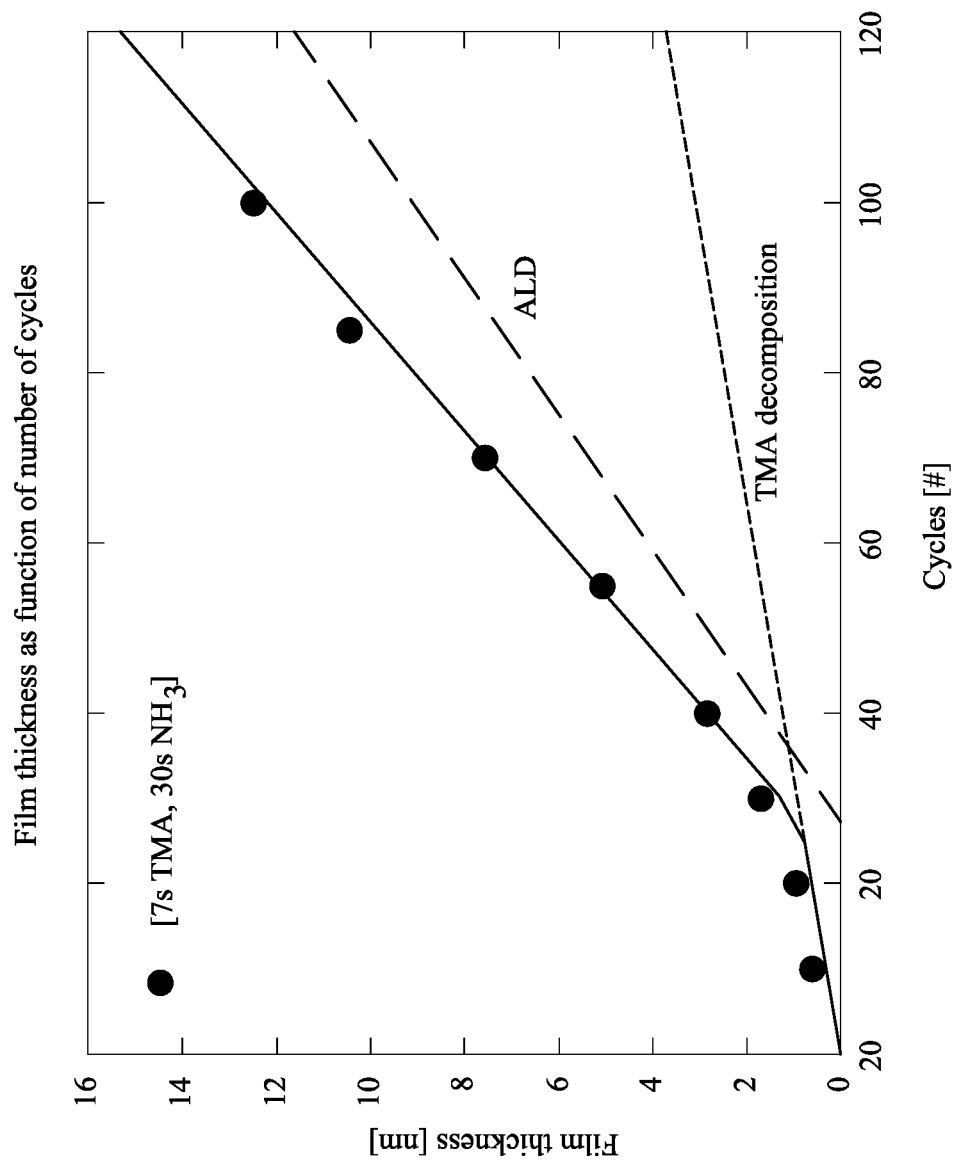
FIG. 6 is a chart showing deposited film thickness as a function of the number of deposition cycles performed, according to some embodiments.

FIG. 6 is a chart showing deposited film thickness as a function of the number of deposition cycles performed. Notably, over the first 30 to 40 cycles, the effective deposition rate is relatively low, with 0.31 Ang/cycle, and then the self-limiting component of 1.25 Ang/cycle is fully developed and the total deposition rate increases to 1.56 Ang/cycle. The low initial deposition rate is believed to be due to the self-limiting component of the AlN being inflicted with an initial inhibition period.

Figure 7:
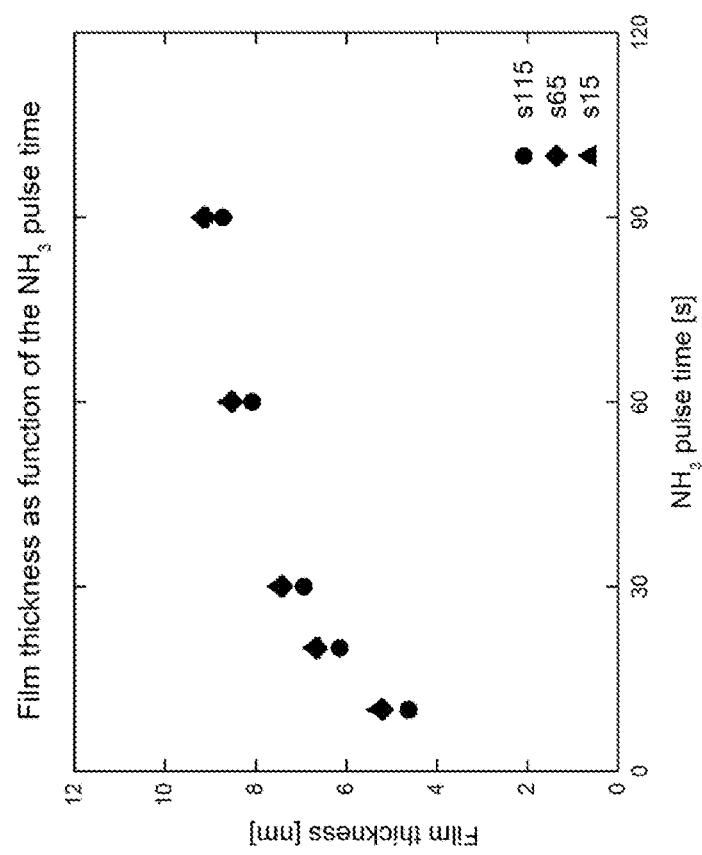
FIG. 7 is a chart showing deposited film thickness as a function of $NH_3$ pulse duration, according to some embodiments.
Figure 8:
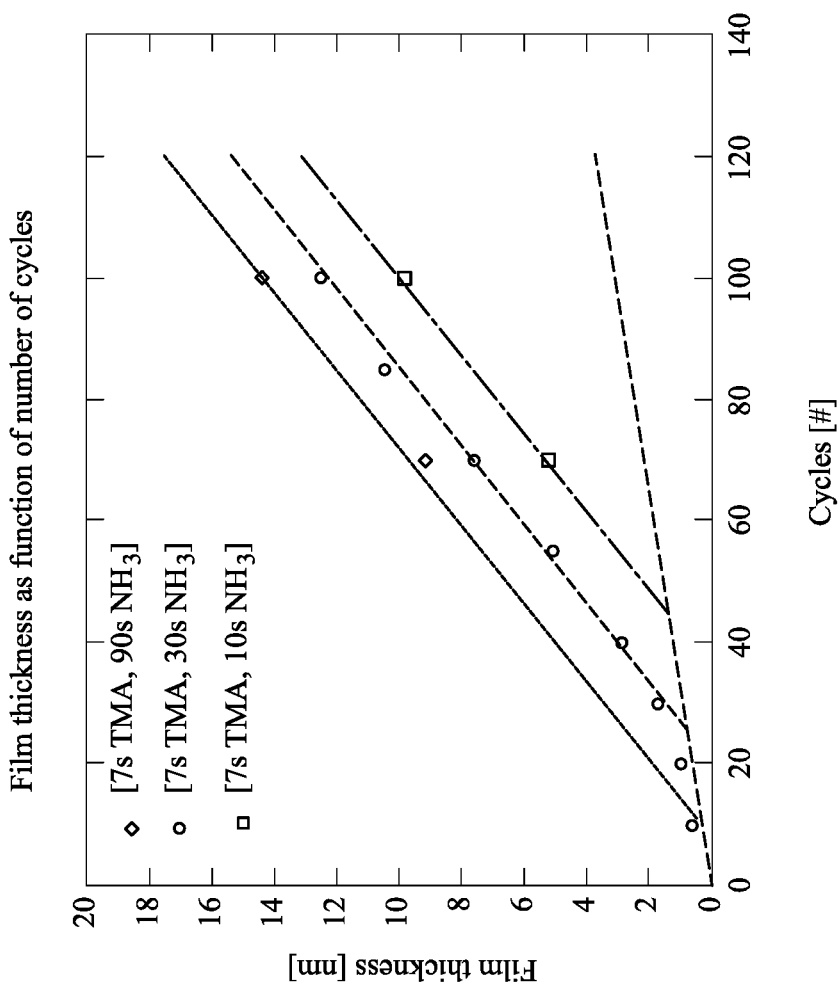
FIG. 8 is a chart showing deposited film thickness as a function of the number of deposition cycles, for various $NH_3$ pulse durations, according to some embodiments.

FIG. 7 is a chart showing deposited film thickness as a function of $NH_3$ pulse duration (for 70 cycles of deposition at 350° C.). The increase in deposited film thickness with increasing $NH_3$ pulse duration can be understood with the help of FIG. 8, showing the film thickness for three wafers at different wafer positions: S15, S65 and S115 are substrates in respectively the bottom, center and top region of the process chamber. It will be appreciated that the triangles and diamonds in the chart substantially overlap, demonstrating good uniformity of the film thickness over the furnace.

FIG. 8 is a chart showing deposited film thickness as a function of the number of deposition cycles, for various $NH_3$ pulse durations. The various $NH_3$ pulse durations were 10, 30, and 90 seconds. It was found that the inhibition period for the self-limiting deposition decreases with increasing $NH_3$ pulse duration. The inhibition period was about 10, about 30, and about 45 cycles for $NH_3$ pulse durations of 90, 30, and 10 seconds, respectively. This resulted in a higher effective deposition rates for longer $NH_3$ pulse durations. However, when the inhibition period was passed, the deposition rate per cycle was substantially equal for all $NH_3$ pulse durations. This indicates that even for the 10 second $NH_3$ pulse duration, fully self-limiting deposition had been obtained. It is contemplated that an $NH_3$ pulse duration of 3 seconds is adequate to obtain fully saturated, self-limiting deposition after passing the inhibition period.

Figure 9:
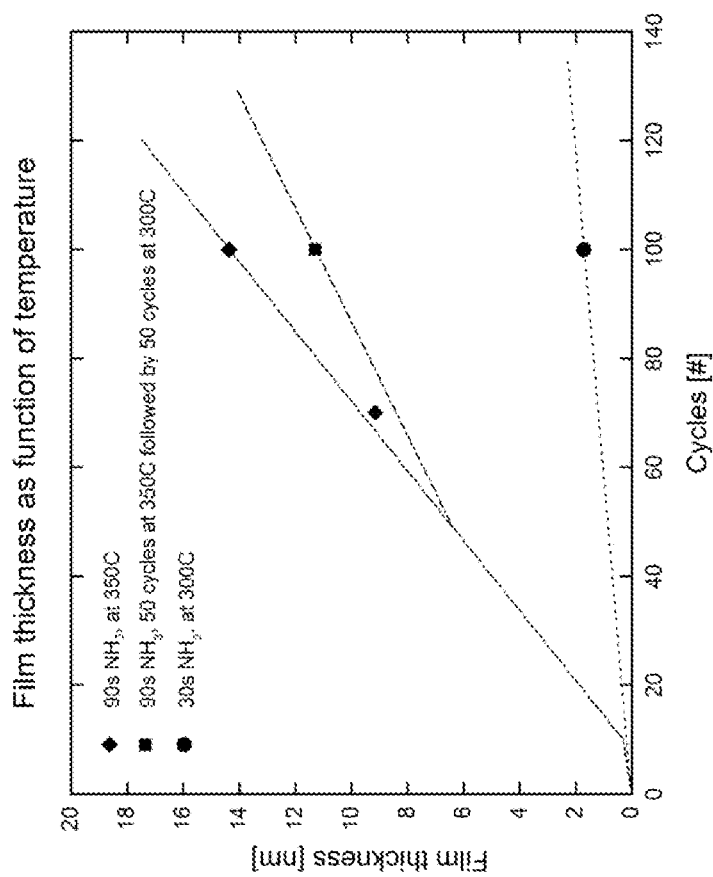
FIG. 9 is a chart showing deposited film thickness as a function of the number of deposition cycles, for different deposition temperatures, according to some embodiments.

FIG. 9 is a chart showing deposited film thickness as a function of the number of deposition cycles, for different deposition temperatures. Most depositions were performed at 350° C. At this temperature, 100 cycles resulted in a film thickness of about 14 nm. When the deposition temperature was lowered to 300° C., 100 cycles resulted in a film thickness of only about 2 nm. However, when the first 50 cycles were performed at 350° C., and then the deposition was continued at a lower temperature of 300° C., only a slight decrease in film thickness, to 11 nm, was observed. It is believed that, at the lower temperature, the inhibition period is substantially longer, resulting in a lower final film thickness. Once a closed AlN was formed, however, the deposited film thickness per cycle is only slightly dependent on the deposition temperature. Thus, it is believed that the surface plays a role in the decomposition of the precursor and the film formation process. These results indicate that a useful range of deposition temperatures for TMA is from about 300° C. to about 375° C. At temperature above 375° C. it is expected that the decomposition rate of TMA becomes so large that the process may no longer be controlled adequately.

Figure 10:
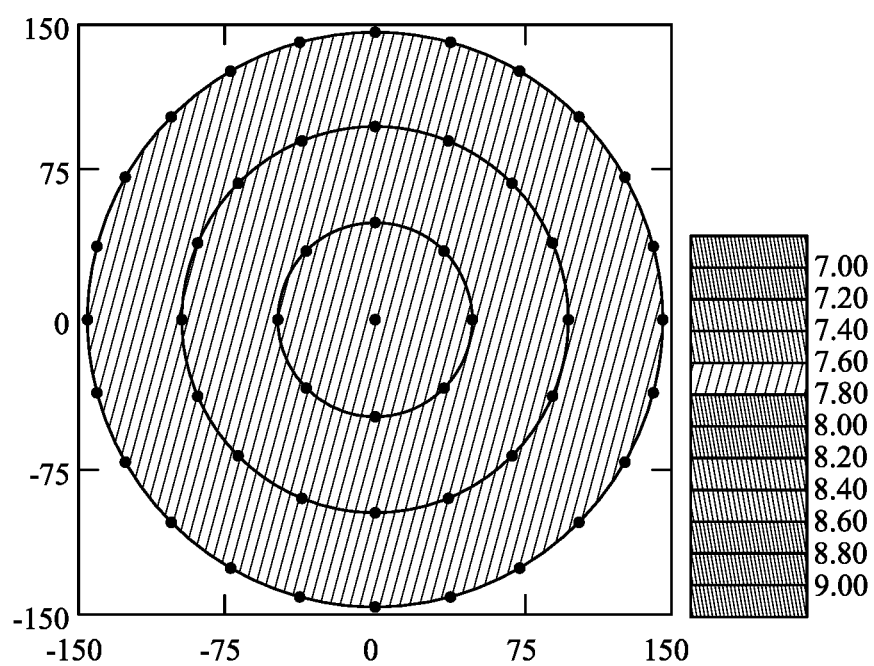
FIG. 10 shows the uniformity of a deposited AlN film, according to some embodiments.

FIG. 10 shows the uniformity of a deposited AlN film. The deposition conditions for this film were as described above were as described above under the example. The AlN film was found to be very uniform, having a film non-uniformity of $1\sigma=0.25\%$ across the substrate. The good uniformity is believed to indicate that the process was strongly surface-controlled. Such surface control is typically associated with a self-limiting process, but here the process had a non-self-limiting component, which made a significant contribution to the deposited film thickness. Nevertheless, the deposition process advantageously provided good surface control of the deposition.

The influence of the purge time on film uniformity was also evaluated. For the TMA purge step, times ranging from 1 seconds to 7 seconds were applied and no influence on the film uniformity was noticed. For the $NH_3$ purge step, purge times ranging from 3 seconds to 30 seconds were applied. For the three shortest purge times (3, 5, and 7 seconds), a significantly higher non-uniformity was observed than for purge times of 15 and 30 seconds, with the highest non-uniformity for the 3 second purge time and the non-uniformity gradually decreasing for the 5 and 7 second purge times. It is contemplated that $NH_3$ purge times of 7 seconds or more, and more preferably 15 seconds or more have advantages for forming highly uniform AlN films.

Although the above noted examples were performed with TMA, it is contemplated that other organic aluminum precursors would provide similar advantageous results. Such precursors are disclosed above, and can include, for example, aluminum alkyl precursors or alkyl-substituted aluminum chlorides or hydrides that have sufficient volatility and a decomposition temperature similar to TMA. Table 1 provides examples of some precursors.

| Al Precursor | Vapor Pressure (Torr) | Al Growth Temp. (° C.) |
|---|---|---|
| Trimethylaluminum (TMA) $(CH_3)_3Al$ | 11 @ 20° C. | 300 |
| Triethylaluminum (TEA) $(CH_3CH_2)_3Al$ | 0.1 @ 36° C. | 160 |
| Triisobutylaluminum (TIBA) $[H(CH_3)_2CCH_2]_3Al$ | 0.1 @ 27° C. | 250 |
| Diethylaluminum chloride (DEACl) $CH_3CH_2)_2AlCl$ | 3 @ 60° C. | 340 |
| Dimethylaluminum hydride (DMAH) $(CH_3)_2AlH$ | 2 @ 25° C. | 240 |
| Tritertiarybutylaluminum $[(CH_3)_3C]_3Al$ | | 300-400° C. |

It will be appreciated by those skilled in the art that various modifications and changes can be made without departing from the scope of the invention. Similar other modifications and changes are intended to fall within the scope of the invention, as defined by the appended claims.

What is claimed is:

1. A method for integrated circuit fabrication, comprising:
    forming an amorphous doped AlN film on a substrate, wherein forming the amorphous doped AlN film comprises:
        forming an AlN film, wherein forming the AlN film comprises:
            performing a plurality of aluminum and nitrogen deposition cycles, each cycle comprising:
                exposing the substrate to an aluminum precursor; and
                subsequently exposing the substrate to a nitrogen precursor; and
        decreasing a crystallinity of the AlN film by doping the AlN film, wherein decreasing the crystallinity of the AlN film by doping the AlN film comprises:
            exposing the substrate to an aluminum precursor; and
            subsequently exposing the substrate to a dopant precursor;
    patterning the doped AlN film; and
    etching the substrate through the patterned doped AlN film.

2. The method of claim 1, wherein the aluminum precursor for the aluminum and nitrogen deposition cycles is the same as for decreasing the crystallinity of the AlN film by doping the AlN film.

3. The method of claim 1, further comprising, after exposing the substrate to the dopant precursor, performing an other plurality of the aluminum and nitrogen deposition cycles.

4. The method of claim 1, wherein performing the plurality of aluminum and nitrogen deposition cycles and decreasing the crystallinity of the AlN film by doping the AlN film constitute a doped AlN deposition cycle, further comprising performing a plurality of doped AlN deposition cycles.

5. The method of claim 1, wherein forming the amorphous doped AN film on the substrate comprises forming the doped AlN film directly on a spin-coated material.

6. The method of claim 5, wherein the spin-coated material is photoresist.

7. The method of claim 1, wherein performing the plurality of aluminum and nitrogen deposition cycles and decreasing the crystallinity of the AlN film by doping the AlN film is conducted in a hot wall batch process chamber.

8. The method of claim 7, wherein the batch process chamber is configured to accommodate 25 or more substrates.

9. The method of claim 1, wherein a stress of the doped AlN film is about 200-700 MPa.

10. The method of claim 1, wherein the doped AlN film is amorphous.

11. The method of claim 1, wherein the doped AlN film comprises at least one of an oxygen, carbon, silicon, boron, phosphorus, sulfur, and germanium dopant.

12. The method of claim 1, wherein exposing the substrate to an aluminum precursor and subsequently exposing the substrate to a dopant precursor constitute a doping cycle, further comprising performing a plurality of doping cycles after performing a plurality of the aluminum and nitrogen deposition cycles.

* * * * *

UNITED STATES PATENT AND TRADEMARK OFFICE
CERTIFICATE OF CORRECTION

| | |
|---|---|
| PATENT NO. | : 9,837,281 B2 |
| APPLICATION NO. | : 15/164575 |
| DATED | : December 5, 2017 |
| INVENTOR(S) | : Bert Jongbloed et al. |

It is certified that error appears in the above-identified patent and that said Letters Patent is hereby corrected as shown below:

In the Specification

In Column 8 at Line 12, Change "$Ch_2H_4$" to --$CH_2H_4$--.

In Column 8 at Line 38, Change "deposted" to --deposited--.

In the Claims

In Column 16 at Line 41 (approx.), In Claim 5, change "AN" to --AlN--.

Signed and Sealed this
Seventeenth Day of April, 2018

Andrei Iancu
*Director of the United States Patent and Trademark Office*